(12) United States Patent
Toyama et al.

(10) Patent No.: US 8,004,901 B2
(45) Date of Patent: Aug. 23, 2011

(54) SEMICONDUCTOR DEVICE AND METHOD FOR CONTROLLING

(75) Inventors: Fumiaki Toyama, Fukushima-Ken (JP); Yukihiro Utsuno, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 350 days.

(21) Appl. No.: 12/341,879

(22) Filed: Dec. 22, 2008

(65) Prior Publication Data
US 2010/0002517 A1    Jan. 7, 2010

(30) Foreign Application Priority Data
Dec. 25, 2007 (JP) .................................. 2007-333154

(51) Int. Cl.
*G11C 16/06* (2006.01)
(52) U.S. Cl. .............. 365/185.21; 365/230.06; 365/171; 365/183; 365/231
(58) Field of Classification Search ............. 365/185.21, 365/230.06, 171, 183, 231
See application file for complete search history.

(56) References Cited

U.S. PATENT DOCUMENTS
6,721,205 B2 *    4/2004    Kobayashi et al. ...... 365/185.26
\* cited by examiner

*Primary Examiner* — Thong Q Le

(57) ABSTRACT

A semiconductor device is disclosed. The semiconductor device includes a plurality of memory cells that are provided in a matrix and that have a charge storage layer made of an insulating film that is provided on a semiconductor substrate and a plurality of word lines that are provided on the charge storage layer. A plurality of memory cells that are arranged in a single line among the plurality of memory cells arranged in the matrix are coupled to the same word line. The semiconductor device further includes an application section that when reading data from a selected memory cell selected from the plurality of memory cells, applies a voltage to a selected word line to be coupled to the selected memory cell among the plurality of word lines. The application section applies a voltage that has a polarity that is opposite to the voltage applied to the selected word line to non-selected word lines arranged on both adjacent sides of the selected word line.

20 Claims, 8 Drawing Sheets

SEMICONDUCTOR DEVICE AND METHOD FOR CONTROLLING

RELATED CASES

This Application claims priority to Japanese Patent Application 2007-333154 entitled "Semiconductor Device and Method for Controlling Thereof" filed Dec. 25, 2007 which is incorporated herein in its entirety.

TECHNICAL FIELD

The present invention relates to a semiconductor device and a method for controlling thereof, and more particularly to a semiconductor device having a non-volatile memory cell and a method for controlling thereof.

BACKGROUND

Non-volatile memories that are capable of rewriting data have attained wide use. In a typical type of non-volatile memory, flash memory, a transistor that configures a memory cell stores data by storing electric charge in a charge storage layer. Floating gate flash memories, that use a floating gate, and silicon oxide nitride oxide silicon (SONOS) flash memories, in which electric charges are stored in a trap layer made of silicon nitride film, use such charge storage layers. One example of the SONOS flash memories, is a flash memory that has a virtual ground memory cell that switches a source and a drain to symmetrically operate.

FIG. 1A is a top view showing an element structure of a flash memory according to a related art example, FIG. 1B is a cross-sectional view between A-A of FIG. 1A, and FIG. 1C is a cross-sectional view between B-B of FIG. 1A. FIG. 1A is shown through an ONO film 18. With reference to FIG. 1A to FIG. 1C, on a semiconductor substrate 10 that is a P-type silicon substrate (or a semiconductor substrate having a p-type region), a tunnel oxide film 12 made of a silicon oxide film, a charge storage layer 14 made of a silicon nitride film that is an insulating film, and a top oxide film 16 made of a silicon oxide film are provided. In the aforementioned process, the ONO film 18 is formed on the semiconductor substrate 10. On the ONO film 18, a plurality of word lines 20 made of polysilicon films, and that also serve as gates are provided so as to extend. In the semiconductor substrate 10, a plurality of bit lines 22 that are N-type diffusion regions, and that also serve as sources and drains are formed so as to extend across the word lines 20.

With reference to FIG. 1A and FIG. 1B, writing of data to a memory cell is described. For example, by rendering a bit line 22 (BL1) as a source and a bit line 22 (BL2) as a drain, a high voltage is applied between the bit lines BL1 and BL2. A positive voltage is applied to a word line 20 (WL2). Due to hot electron effects, electrons are injected into the charge storage layer 14, and the electrons (electric charges) can be stored in a charge storage region C1. Further, by switching the source and the drain, electrons (electric charges) can be stored in a charge storage region C2.

When reading data from a memory cell, the threshold voltage of a transistor configuring the memory cell becomes high due to electric charges stored in a charge storage region. By measuring such threshold voltage by current levels, data written in the memory cell can be read.

Japanese Patent Application Publication No. 9-102199 discloses a technology that, when reading data from a memory cell array having a plurality of memory cells, applies a negative voltage to all word lines of non-selected memory cells coupled to selected memory cells via a bit line to read data only from the selected memory cells. Japanese Patent Application Publication No. 11-330277 discloses a technology that, when reading data of a MONOS flash memory, applies a positive voltage to a word line of a memory cell in which data is not read to reduce read-disturbance.

SUMMARY

It is an object of the present invention to provide a semiconductor device capable of, when reading data from a memory cell, suppressing generation of fringe currents and rendering a reading margin large, and a method for controlling thereof.

The semiconductor device includes a plurality of memory cells that are provided in a matrix and that have a charge storage layer made of an insulating film that is provided on a semiconductor substrate and a plurality of word lines that are provided on the charge storage layer. A plurality of memory cells that are arranged in a single line among the plurality of memory cells arranged in the matrix are coupled to the same word line. The semiconductor device further includes an application section that when reading data from a selected memory cell selected from the plurality of memory cells, applies a voltage to a selected word line to be coupled to the selected memory cell among the plurality of word lines. The application section applies a voltage that has a polarity that is opposite to the voltage applied to the selected word line to non-selected word lines arranged on both adjacent sides of the selected word line.

BRIEF DESCRIPTION OF THE DRAWINGS

The accompanying drawings, which are incorporated in and form a part of this specification, illustrate embodiments and, together with the description, serve to explain the principles of the embodiments.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1A:
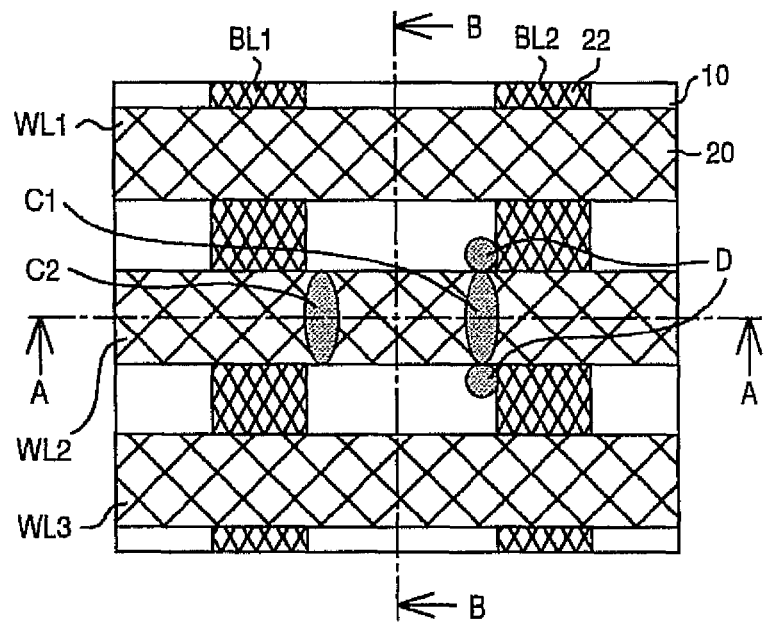
FIG. 1A is a top view of an element structure of a flash memory according to a related art example.
Figure 1B:
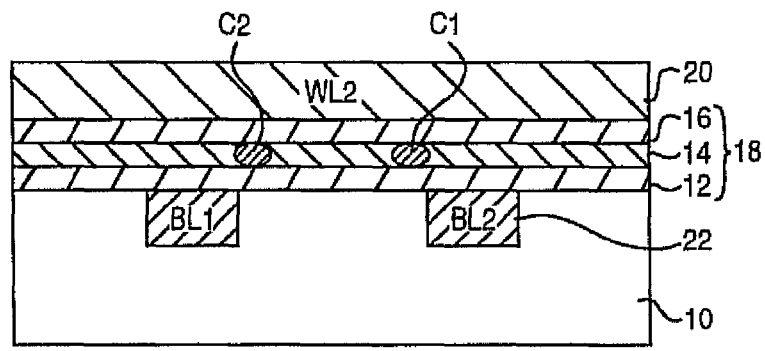
FIG. 1B is a cross-sectional view of A-A shown in FIG. 1A.
Figure 1C:
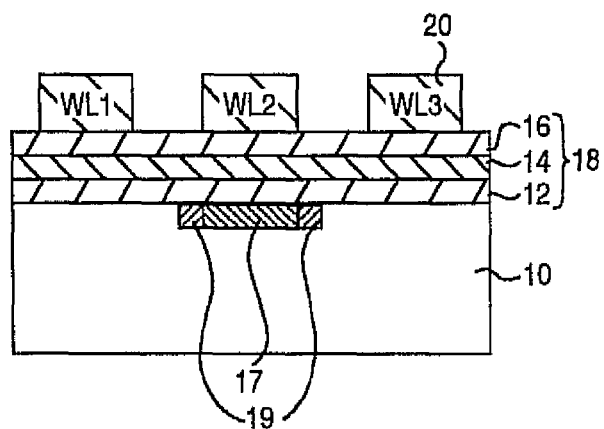
FIG. 1C is a cross-sectional view of B-B shown in FIG. 1A.

According to a related art example shown in FIG. 1A to FIG. 1C, the plurality of word lines 20 (for example, WL1 to WL3) are provided on the same charge storage layer 14. Thus, when writing data, as shown in FIG. 1A to FIG. 1C, not only electrons pass through a normal channel region 17 directly below the word line 20 (WL2) and electric charges are stored in the charge storage region C1, but also electrons pass through an enlarged channel region 19 (such currents are called fringe currents) and electric charges are stored in a charge storage region D in the vicinity of the word line 20 (WL2). Since the charge storage layer 14 is made of an insulating film, the electrons (electric charges) stored in the charge storage region C1 and the charge storage region D stay therein.

The charge density of the enlarged channel region 19 is smaller than the charge density of the normal channel region 17. Thus, fringe currents are more likely to flow there as compared to currents flowing through the normal channel region 17. Thus, when reading data from the memory cell, the threshold voltage of a transistor becomes high due to electric charges stored in the charge storage region, whereby fringe currents flow even in a case where, normally, currents do not flow. Thus, the effective threshold voltage of the transistor decreases. That is, a reading margin when reading data becomes small. Particularly, when electric charges are stored in the charge storage region D, fringe currents are more likely to occur.

Figure 2:
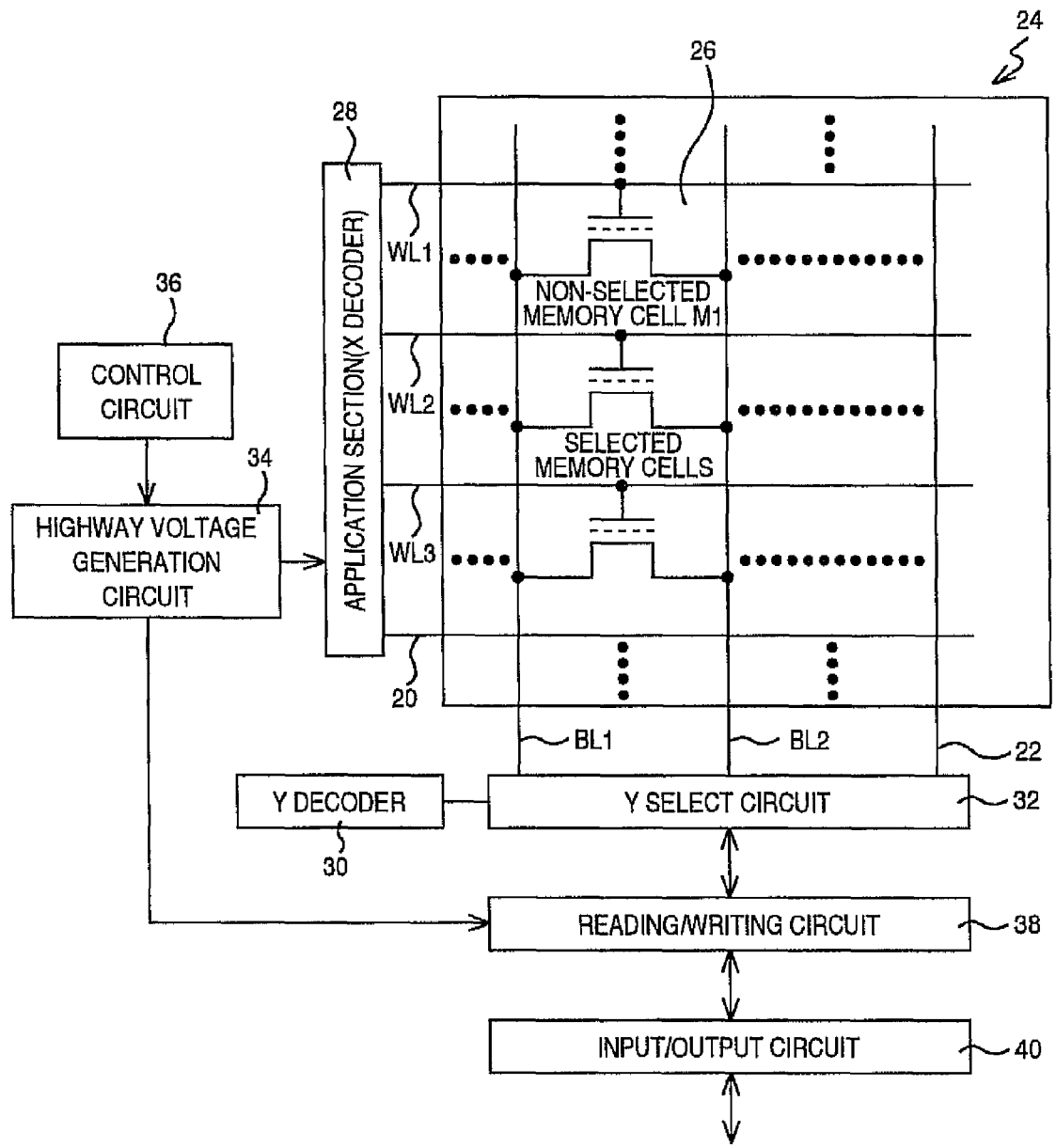
FIG. 2 is a block diagram of a flash memory according to one embodiment.

FIG. 2 is a block diagram of a flash memory according to the comparative example. With reference to FIG. 2, in a memory cell array 24, a plurality of memory cells 26 are arranged in a matrix. Gates of a plurality of transistors configuring a plurality of memory cells 26 arranged in a single line among the plurality of memory cells 26 are coupled to the same word line 20. Sources and drains of the plurality of transistors configuring the plurality of memory cells 26 arranged in a single column are respectively coupled to the same bit lines 22. Since an element structure of the flash memory according to the comparative example is the same as that of the related art example and is shown in FIG. 1A to FIG. 1C, descriptions thereof are omitted here.

Based on an instruction of a control circuit 36, a high voltage generation circuit 34 supplies a voltage for writing, reading, and erasing data. An application section 28 that is an X decoder selects the word line 20, and applies thereto the voltage supplied from the high voltage generation circuit 34. A Y decoder 30 makes a Y select circuit 32 to select the bit line 22. A reading/writing circuit 38 applies the voltage supplied from the high voltage generation circuit 34 to the bit line 22 via the Y select circuit 32, and writes data input from an input/output circuit 40 to the memory cells 26 (selected memory cell S). Further, the reading/writing circuit 38 reads data of the selected memory cell S, and outputs to the input/output circuit 40. The input/output circuit 40 outputs data input from the reading/writing circuit 38 to the outside, and outputs data input from the outside to the reading/writing circuit 38.

Next, Table 1 shows a voltage normally used by the application section 28 for applying to the word line 20 and a voltage normally used by the reading/writing circuit 38 for applying to the bit line 22 in a case when writing data to the selected memory cell S and in a case when reading data from the selected memory cell S in FIG. 2. Moreover, the word line 20 coupled to the selected memory cell S is rendered as the selected word line WL2, and the word lines 20 arranged on both adjacent sides of the selected word line WL2 are rendered as the non-selected word line WL1 and the non-selected word line WL3. The bit lines 22 coupled to the selected memory cell S are rendered as the bit line 22 (BL1) and the bit line 22 (BL2).

TABLE 1

|  | Writing | Reading |
| --- | --- | --- |
| WL1 | 0[V] | 0[V] |
| WL2 | +9.0[V] | +4.6[V] |
| WL3 | 0[V] | 0[V] |
| BL1 | 0[V] | +1.4[V] |
| BL2 | +4.0[V] | 0[V] |

With reference to Table 1 and FIG. 2, in a case of writing data to the selected memory cell S, the application section 28 applies a voltage of +9.0[V] to the selected word line WL2, and the non-selected word lines WL1 and WL3 are coupled to the ground (0[V]), or made into an open state. The reading/writing circuit 38 applies a voltage of +4.0[V] to the bit line 22 (BL2), and the bit line 22 (BL1) is coupled to the ground (0[V]), or made into an open state.

Next, when reading data from the selected memory cell S, the application section 28 applies a voltage of +4.6[V] to the selected word line WL2, and the non-selected word lines WL1 and WL3 are coupled to the ground (0[V]), or made into an open state. The reading/writing circuit 38 applies a voltage of +1.4[V] to the bit line 22 (BL1), and the bit line 22 (BL2) is coupled to the ground (0[V]), or made into an open state.

Figure 3:
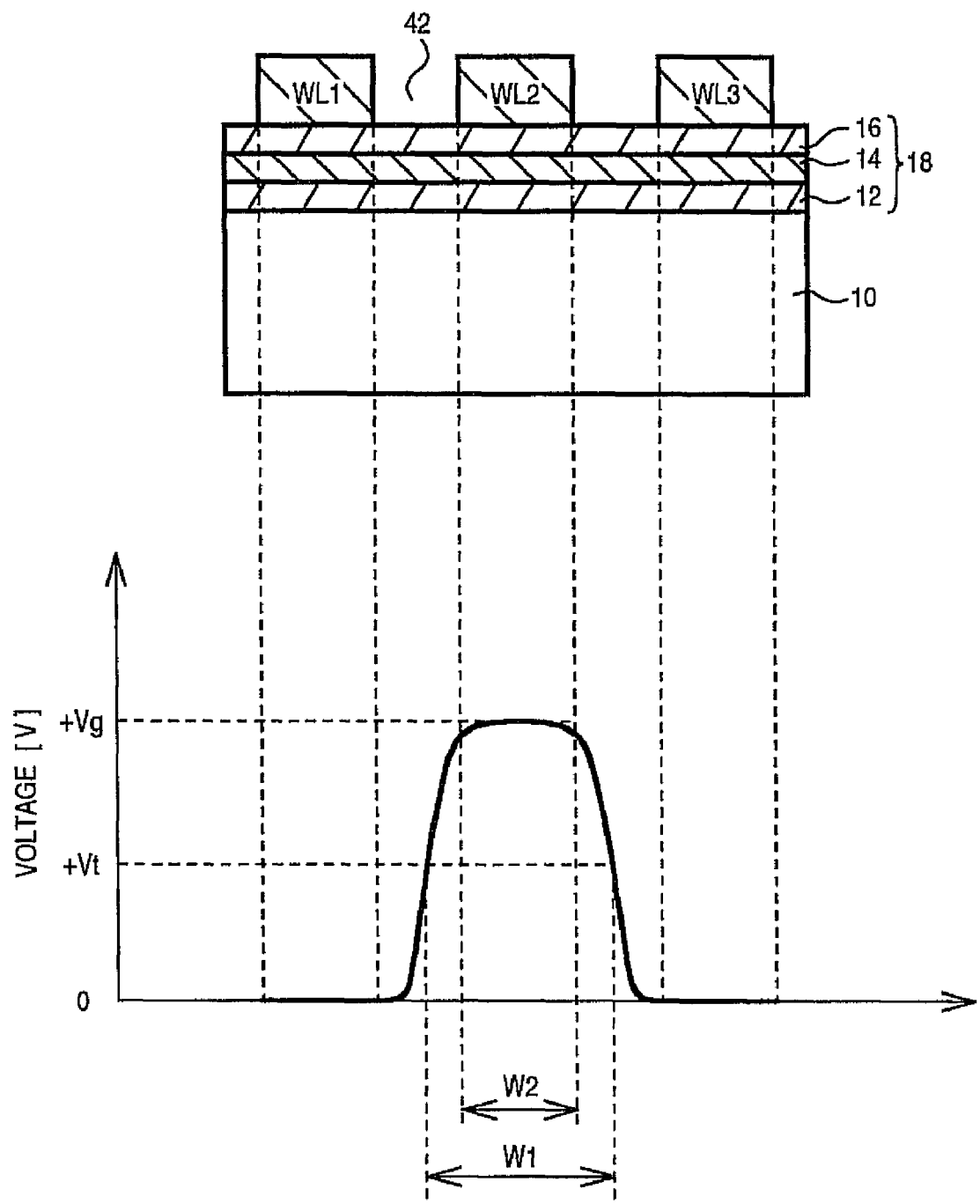
FIG. 3 is a schematic diagram showing a potential distribution of a semiconductor substrate when reading data from a memory cell of the flash memory according to one embodiment.

FIG. 3 shows a potential size at each position of the semiconductor substrate 10 when reading data from the selected memory cell S. With reference to FIG. 3, a potential of the semiconductor substrate 10 directly below the selected word line WL2 has a potential (+Vg[V]) obtained by subtracting a voltage that is lowered through the ONO film 18 from the voltage (+4.6[V]) applied to the selected word line WL2. Since the non-selected word lines WL1 and WL3 are coupled to the ground (0[V]), a potential of the semiconductor substrate 10 directly below the non-selected word lines WL1 and WL3 is virtually 0[V]. A potential of the semiconductor substrate 10 of a region 42 between the word lines (a region between the non-selected word line WL1 and the selected word line WL2, and a region between the selected word line WL2 and the non-selected word line WL3) varies from +Vg[V] to 0[V] in a curve of moderate gradient.

According to the comparative example, as shown in FIG. 1A to FIG. 1C, the selected word line WL2 and the non-selected word lines WL1 and WL3 are provided on the same charge storage layer 14. Thus, the potential of the semiconductor substrate 10 of the region 42 between the word lines are affected by the voltage applied to the selected word line WL2 and the non-selected word lines WL1 and WL3. Thus, as shown in FIG. 3, the semiconductor substrate 10 in the region 42 between the word lines has a positive potential that varies from +Vg[V] to 0[V] in a curve of moderate gradient. Consequently, an effective channel width W1 in a threshold voltage +Vt[V] of the transistor configuring the selected memory cell S becomes wider compared to a theoretical channel width W2. Thus, the amount of fringe currents flowing through the enlarged channel region 19 increases as shown in FIG. 1A and FIG. 1C. By the above, since fringe currents increase in the comparative example, the effective threshold voltage of the transistor decreases, and a data reading margin becomes small.

In order to solve the problems described above, an embodiment of the present invention will be described below. A block diagram of a flash memory according to a first embodiment of the present invention is the same as that of the comparative example and is shown in FIG. 2, and thus the description thereof is omitted. Also, an element structure of the flash memory according to the first embodiment is the same as that of the comparative example and is shown in FIG. 1A to FIG. 1C, and thus the description thereof is omitted.

Figure 4:
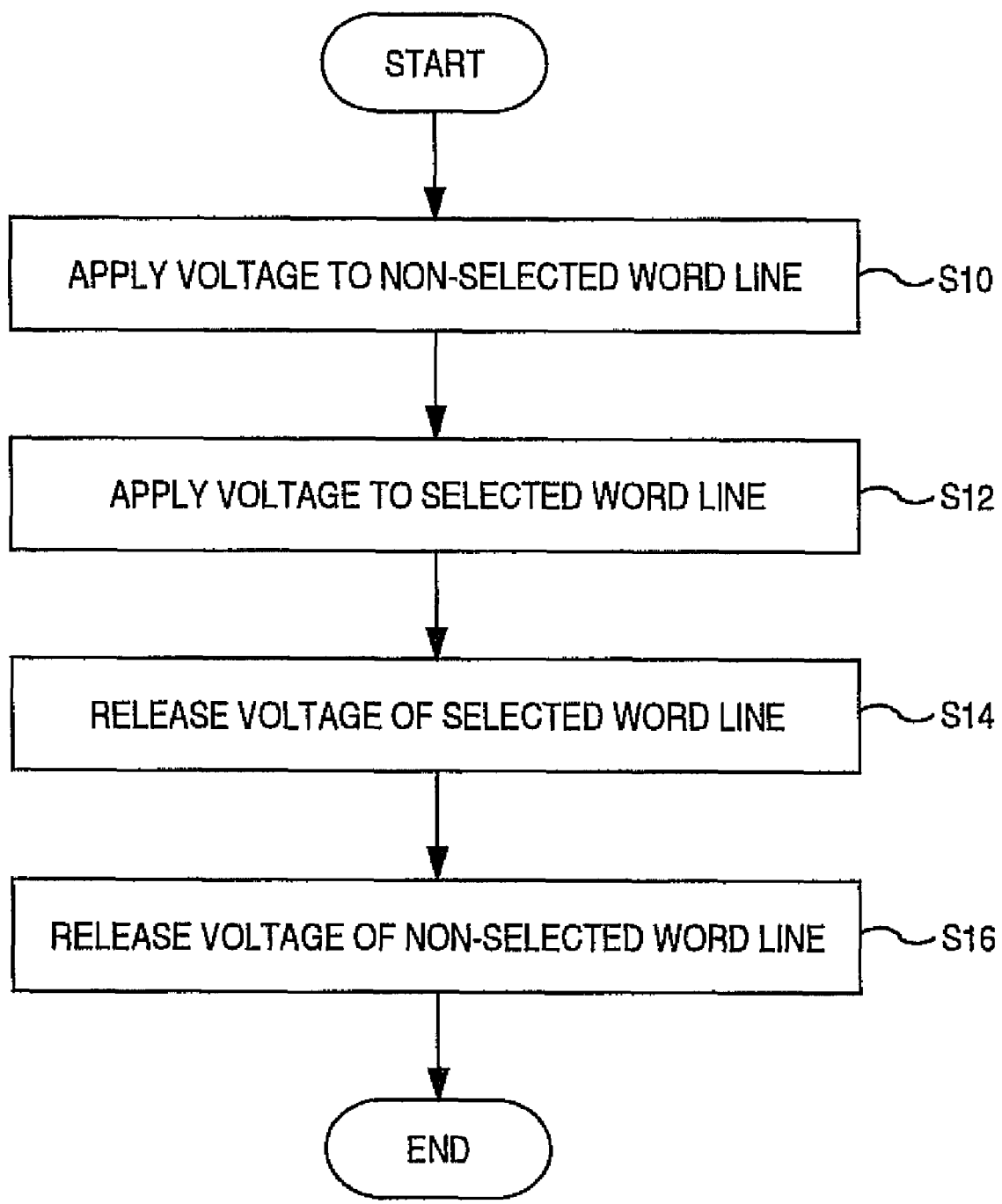
FIG. 4 is a flowchart of steps performed as a part of the control of a voltage applied to a word line when reading data from a memory cell of a flash memory according to one embodiment.

FIG. 4 is a flow chart showing the control of voltage applied by the application section 28 to the word lines 20 when reading data from the selected memory cell S. Table 2 shows voltage applied by the application section 28 to the word lines 20 and voltage applied by the reading/writing circuit 38 to the bit lines 22 when reading data from the selected memory cell S. With reference to Table 2, the application section 28 applies a voltage of +4.6[V] to the selected word line WL2, and applies a voltage of −4.6[V] to the non-selected word lines WL1 and WL3. The reading/writing circuit 38 applies a voltage of +1.4[V] to the bit line 22 (BL1), and the bit line 22 (BL2) is coupled to the ground (0[V]), or made into an open state.

TABLE 2

|     | Reading  |
| --- | -------- |
| WL1 | −4.6[V]  |
| WL2 | +4.6[V]  |
| WL3 | −4.6[V]  |
| BL1 | +1.4[V]  |
| BL2 | 0[V]     |

With reference to FIG. 4, the application section 28 applies a voltage of −4.6[V] to the non-selected word lines WL1 and WL3 (step S10). Thereafter, a voltage of +4.6[V] is applied to the selected word line WL2 (step S12). After reading data from the selected memory cell S completes, the voltage of +4.6[V] applied to the selected word line WL2 is released (step S14). Then, the voltage of −4.6[V] applied to the non-selected word lines WL1 and WL3 are released (step S16).

Figure 5:
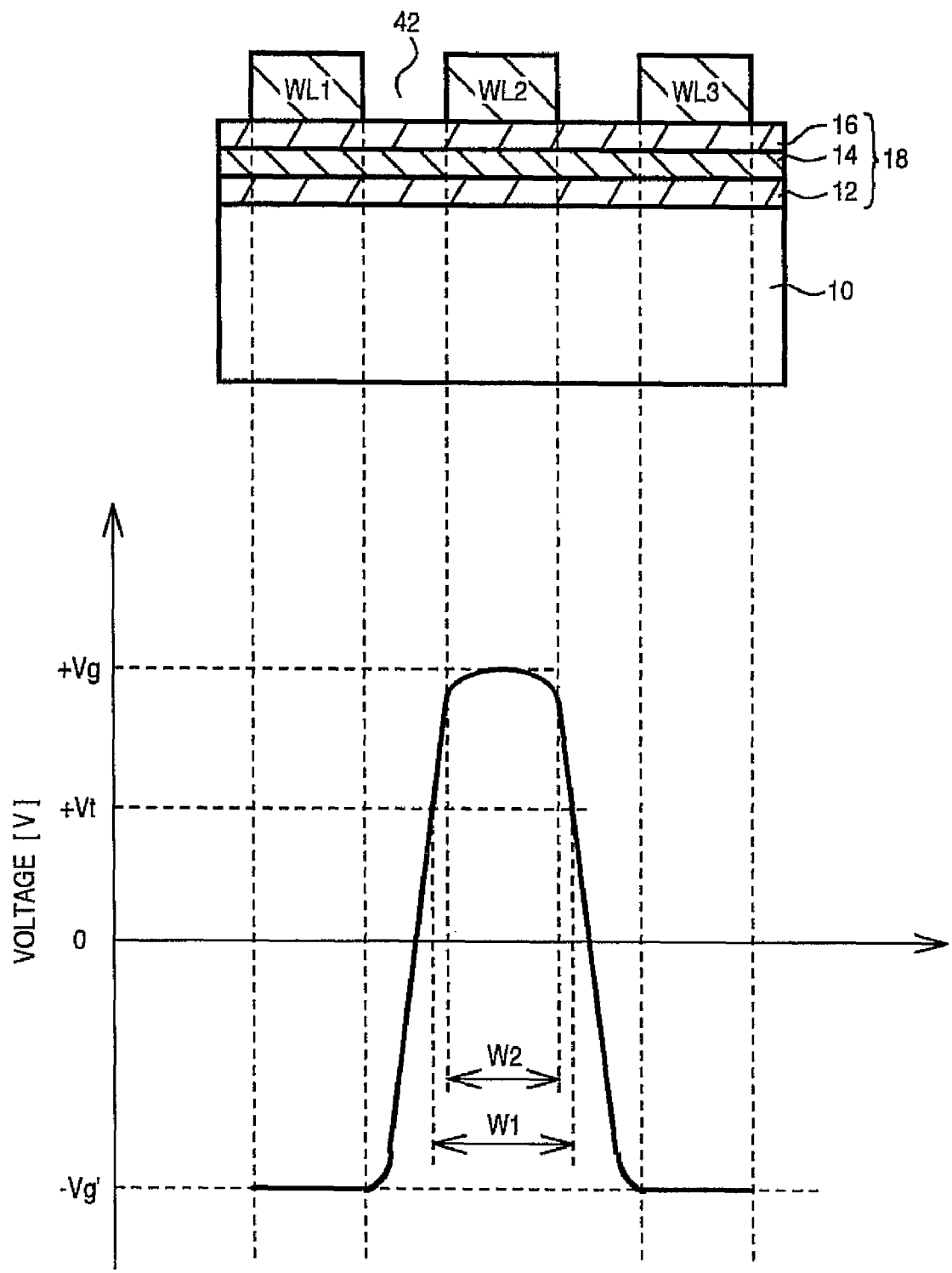
FIG. 5 is a schematic diagram showing a potential distribution of a semiconductor substrate when reading data from the memory cell of the flash memory according to one embodiment.

FIG. 5 shows a potential size at each section of the semiconductor substrate 10 when reading data from the selected memory cell S. With reference to FIG. 5, a potential of the semiconductor substrate 10 directly below the selected word line WL2 has a potential (+Vg[V]) obtained by subtracting a voltage that is lowered through the ONO film 18 from the voltage (+4.6[V]) applied to the selected word line WL2. A potential of the semiconductor substrate 10 directly below the non-selected word lines WL1 and WL3 has a potential (−Vg'[V]) obtained by subtracting a voltage lowered through the ONO film 18 from the voltage (−4.6[V]) applied to the non-selected word lines WL1 and WL3. A potential of the semiconductor substrate 10 in the region 42 between the word lines varies from +Vg[V] to −Vg'[V] in a curve of steep gradient.

According to the first embodiment, as shown in FIG. 1A to FIG. 1C, corresponding to the comparative example, the selected word line WL2 and the non-selected word lines WL1 and WL3 are provided on the same charge storage layer 14. Thus, a potential of the semiconductor substrate 10 in the region 42 between the word lines is affected by the voltage applied to the selected word line WL2 and the non-selected word lines WL1 and WL3. Also, as shown in Table 2, the application section 28 applies the voltage of +4.6[V] to the selected word line WL2 to be coupled to the selected memory cell S, and applies the voltage of −4.6[V] that is a voltage having an opposite sign (positive/negative) to the voltage applied to the selected word line WL2 to the non-selected word lines WL1 and WL3 arranged on both adjacent sides of the selected word line WL2. By the above, as shown in FIG. 5, the potential of the semiconductor substrate 10 in the region 42 between the word lines varies from +Vg[V] to −Vg'[V] in a curve of steep gradient. Thus, the effective channel width W1 in the threshold voltage +Vt[V] of the transistor configuring the selected memory cell S can be made narrower compared to the comparative example. Therefore, fringe currents flowing through the enlarged channel region 19 can be suppressed compared to the comparative example.

Figure 6:
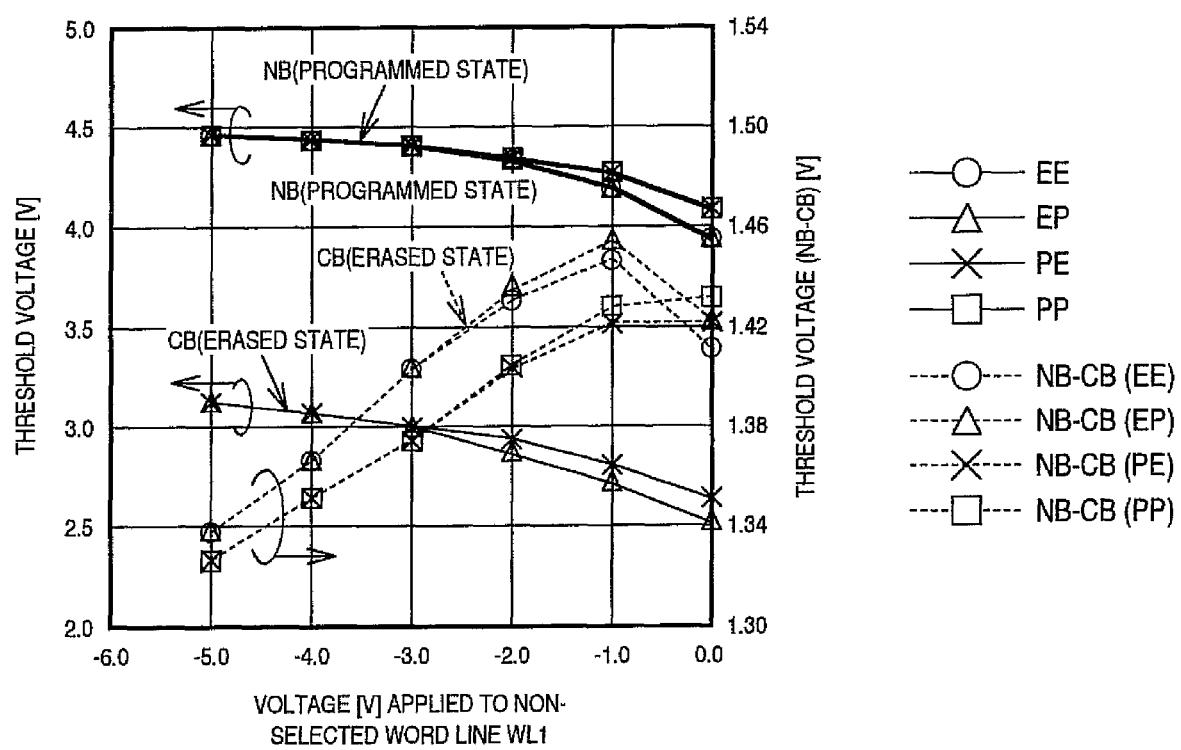
FIG. 6 is a simulation result of calculation of the threshold voltage of a transistor configuring a selected memory cell when reading data from the selected memory cell according to one embodiment.

Next, advantageous effects of the first embodiment will be explained with reference to FIG. 6. FIG. 6 is a simulation result of calculation of the threshold voltage of the transistor configuring the selected memory cell S in a case when reading data from the selected memory cell S. Also, with reference to FIG. 7, the selected memory cell S used for the calculation simulation in FIG. 6 and a non-selected memory cell M (see FIG. 2) arranged next to the selected memory cell S will be explained.

Figure 7:
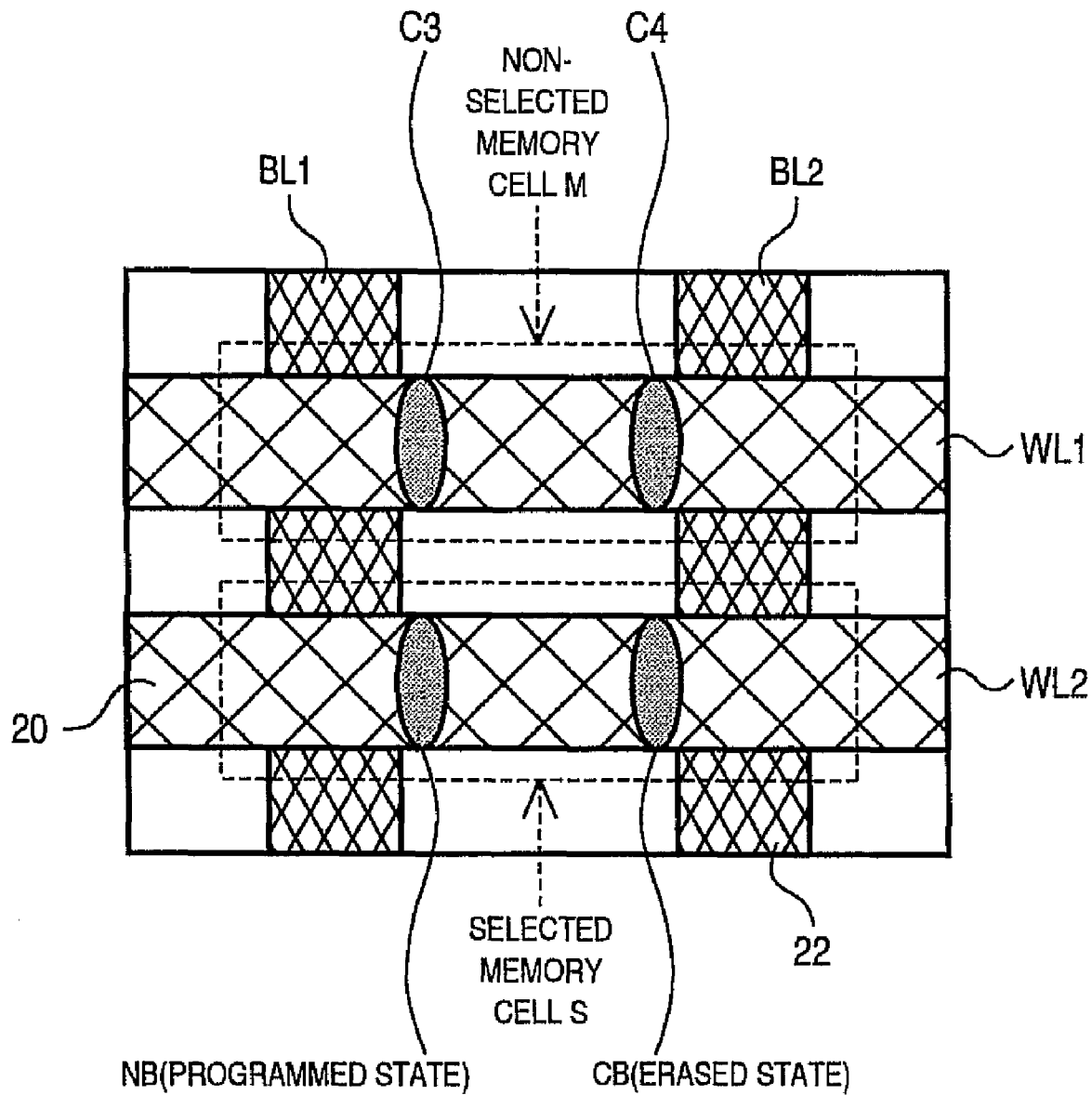
FIG. 7 is a schematic diagram illustrating the selected memory cell used for the simulation calculation in FIG. 6 and an adjacent non-selected memory cell.

With reference to FIG. 7, a charge storage region NB corresponding to a normally bit (NB) of the selected memory cell S is in a state where electric charges are stored (programmed state), and a charge storage region CB corresponding to a complimentary bit (CB) is in a state where electric charges are not stored (erased state). Hereinafter, the charge storage region NB is expressed as NB (programmed state), and the charge storage region CB is expressed as CB (erased state). In a state where a positive voltage (for example, +4.6 [V]) is applied to the selected word line WL2, data can be read from NB (programmed state) by coupling the bit line 22 (BL1) to the source and the bit line 22 (BL2) to the drain. Also, data can be read from CB (erased state) by coupling the bit line 22 (BL1) to the drain and the bit line 22 (BL2) to the source. Charged states of the two charge storage regions (C3 and C4) of the non-selected memory cell M are shown in Table 3. The distance between the selected word line WL2 coupled to the selected memory cell S and the non-selected word line WL1 coupled to the non-selected memory cell M is 60 nm.

With reference to Table. 3, a state where the charge storage regions C3 and C4 are both in an erased state is expressed as an EE state. A state where the charge storage region C3 is in an erased state and the charge storage region C4 is in a programmed state is expressed as an EP state. A state where the charge storage region C3 is in a programmed state and the charge storage region C4 is in an erased state is expressed as a PE state. A state where the charge storage regions C3 and C4 are both in a programmed state is expressed as a PP state.

TABLE 3

|  | Charge storage region C3 | Charge storage region C4 |
|---|---|---|
| EE state | Erased state | Erased state |
| EP state | Erased state | Programmed state |
| PE state | Programmed state | Erased state |
| PP state | Programmed state | Programmed state |

With reference to FIG. 6, the lateral axis shows the size of a voltage applied to the non-selected word line WL1. The scale on the left side of the vertical axis shows the size of the threshold voltage (hereinafter, the threshold voltage of NB) when reading data from NB (programmed state) and the threshold voltage (hereinafter, the threshold voltage of CB) when reading data from CB (erased state), and the scale on the right side shows the difference between the threshold voltage of NB and the threshold voltage of CB. The thick solid line of FIG. 6 shows the threshold voltage of NB in each charged state (states of EE, EP, PE, and PP) of the non-selected memory cell M. The thin solid line shows the threshold voltage of CB in each charged state (states of EE, EP, PE, and PP) of the non-selected memory cell M. The dashed line shows the difference between the threshold voltage of NB and the threshold voltage CB in each charged state (states of EE, EP, PE, and PP) of the non-selected memory cell M.

According to FIG. 6, the smaller the voltage applied to the non-selected word line WL1 is made (absolute value is made large), the larger the threshold voltage of NB (thick solid line) and the threshold voltage of CB (thin solid line) becomes. However, the difference (dashed line) between the threshold voltage of NB and the threshold voltage of CB is made smaller. On the other hand, the distribution of the threshold voltage of NB (thick solid line) and the distribution of the threshold voltage of CB (thin solid line) is made smaller.

Figure 8:
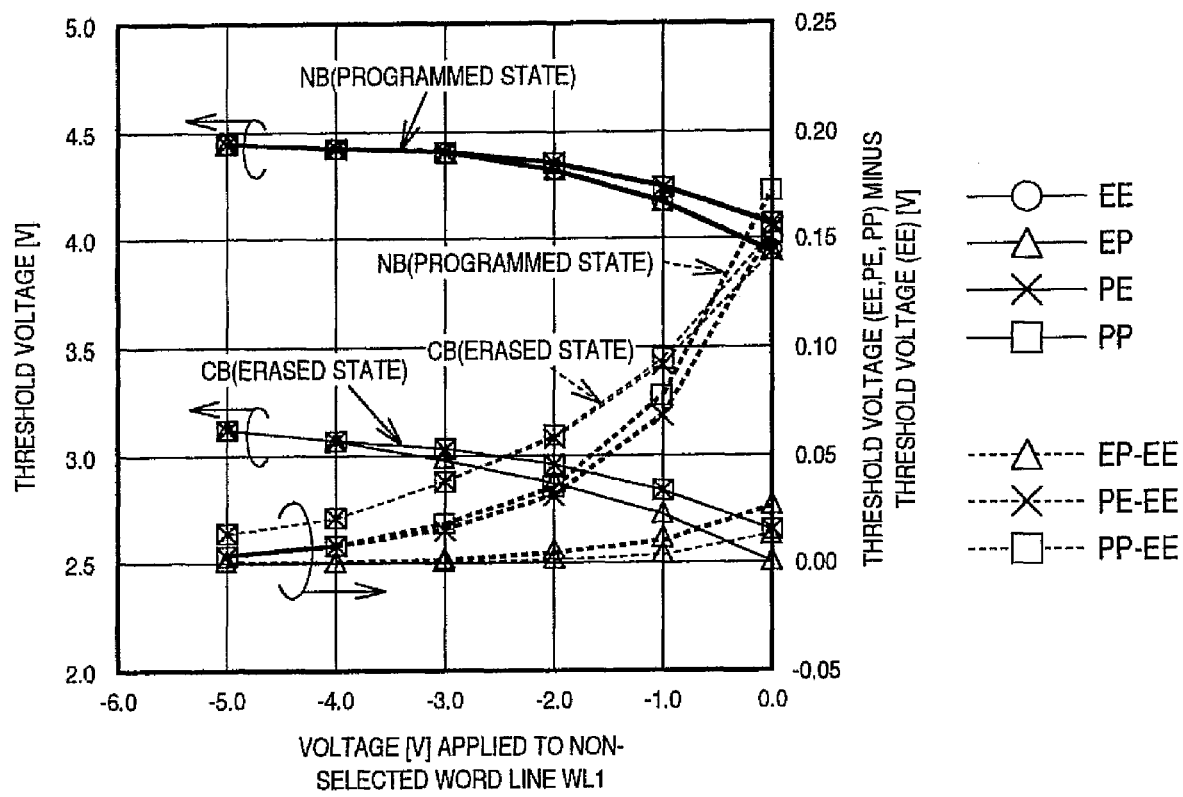
FIG. 8 is a view showing a distribution of the threshold voltage of the transistor configuring the selected memory cell associated with the simulation result in FIG. 6.

FIG. 8 is a view precisely showing the distribution of the threshold voltage of NB and the distribution of the threshold voltage of CB. With reference to FIG. 8, the scales on the lateral axis and on the left side of the vertical axis are the same as those in FIG. 6. The scale on the right side of the vertical axis shows the difference between the threshold voltage of NB (and the threshold voltage of CB) in the states of EP, PE, and PP, and the threshold voltage of NB (and the threshold voltage of CB) in the EE state. Also, the thick solid line and the thin solid line of FIG. 8 are the same as those in FIG. 6. The thick dashed line shows a value obtained by subtracting the threshold voltage of NB (EE) from the threshold voltage of NB (EP, PE, PP), and the thin dashed line shows a value obtained by subtracting the threshold voltage of CB (EE) from the threshold voltage of CB (EP, PE, PP).

With reference to FIG. 8, the more the voltage applied to the non-selected word line WL1 is made small (absolute value is made large), the more the value obtained by subtracting the threshold voltage of NB (EE) from the threshold voltage of NB (EP, PE, PP) and the value obtained by subtracting the threshold voltage of CB (EE) from the threshold voltage of CB (EP, PE, PP) become closer to 0. That is, when reading data from the selected memory cell S, by making the voltage applied to the non-selected word line WL1 small (making the absolute value large), the threshold voltage of the transistor configuring the selected memory cell S is hardly affected by the charged state of the non-selected memory cell M.

Consequently, when reading data from the memory cell array 24 as shown in FIG. 2, even in a case where the memory cells 26 in the programmed state and in the erased state are randomly existing in the plurality of memory cells 26 arranged in a matrix, the distribution of the threshold voltage of the transistor configuring the memory cell 26 can be made small for the memory cell array 24 as a whole. That is, the distribution of a reading margin can also be made small. Consequently, an advantageous effect can be obtained in that the reading margin can be made large when reading data from the memory cell array 24 including the plurality of memory cells 26.

In the first embodiment, as a method for controlling a voltage applied to the word line 20 by the application section 28 when reading data from the selected memory cell S, as shown in FIG. 4, the application section 28 applies a voltage having an opposite sign to the voltage applied to the selected word line WL2 to the non-selected word lines WL1 and WL3 (step S10). Thereafter, a voltage is applied to the selected word line WL2 (step S12). After reading data from the selected memory cell S completes, the voltage applied to the selected word line WL2 is released (step S14). Thereafter, a case (step S16) of releasing the voltage applied to the non-selected word lines WL1 and WL3 is shown. However, the invention is not limited thereto. The method can be of any form as long as the application section 28 keeps applying a voltage having an opposite sign to the voltage applied to the selected word line WL2 to the non-selected word lines WL1 and WL3 at least during applying a voltage to the selected word line WL2. For example, a case where the application section 28 applies a voltage to the selected word line WL2 and the non-selected word lines WL1 and WL3 at the same time. It is also possible in this case, as shown in FIG. 5, to narrow the effective channel width W1 and suppress fringe currents.

As shown in FIG. 1A and FIG. 1C, a case where the charge storage layer 14 is made of a silicon nitride film is shown, however, the invention is not limited thereto, and the charge storage layer 14 can be made of other insulating films. Also, a case of storing electrons in the charge storage layer 14 by hot electron effects is shown. However, the invention is not limited thereto. In a case where the charge storage layer 14 is made of an insulating film, and electrons are stored in the charges storage layer 14 by hot electron effects, as shown in FIG. 1A and FIG. 1C, electrons (electric charges) are stored in the charge storage region C1 and the charge storage region D, and the electrons (electric charges) stay in the charge storage region C1 and the charge storage region D. Thus, when reading data from the memory cell, fringe currents are likely to occur. Consequently, when reading data from the memory cell, by applying a voltage having an opposite sign to a voltage applied to the selected word line WL2 to the non-selected word lines WL1 and WL3, the effective channel width W1 in the threshold voltage of the transistor configuring the selected memory cell can be made narrow. Furthermore, advantageous effects of the present invention that suppresses the generation of fringe currents become large.

With reference to exemplary embodiments thereof, a semiconductor device is disclosed. The semiconductor device includes a plurality of memory cells that are provided in a matrix and that have a charge storage layer made of an insulating film that is provided on a semiconductor substrate and a plurality of word lines that are provided on the charge storage layer. A plurality of memory cells that are arranged in a single line among the plurality of memory cells arranged in the matrix are coupled to the same word line. The semiconductor device further includes an application section that when reading data from a selected memory cell selected from the plurality of memory cells, applies a voltage to a selected word line to be coupled to the selected memory cell among the plurality of word lines. The application section applies a voltage that has a polarity that is opposite to the voltage applied to the selected word line to non-selected word lines arranged on both adjacent sides of the selected word line.

In one embodiment, the application section may keep applying a voltage to the non-selected word lines while applying a voltage to the selected word line. According to such arrangement, when reading data from the memory cell, generation of fringe currents can be suppressed, and a reading margin can be made large.

In one embodiment, the selected word line and the non-selected word lines can be provided on the same charge storage layer. According to such arrangement, electric charges are also stored in the charge storage layer in the vicinity of the selected word line, whereby fringe currents are likely to occur. Thus, advantageous effects of the present invention of suppressing generation of fringe currents become large.

In one embodiment, the charge storage layer can be made of a silicon nitride film. Also, in the above-described arrangement, electrons may be stored in the charge storage layer by hot electron effects. According to such arrangement, electric charges are stored in the charge storage layer in the vicinity of the selected word line, whereby fringe currents are likely to occur. Thus, advantageous effects of the present invention of suppressing generation of fringe currents become large.

In one embodiment the arrangement may further include: a plurality of bit lines provided crossing the plurality of word lines in the semiconductor substrate so that a plurality of memory cells arranged in a single column among the plurality of memory cells arranged in a matrix are coupled to the same bit lines.

According to the present invention, when reading data from the memory cell, generation of fringe currents can be suppressed, and degradation of the effective threshold voltage can be suppressed. Consequently, a reading margin can be made large.

In one embodiment, during the applying of the voltage to the selected word line, the applying of the voltage having the opposite polarity to the voltage applied to the selected word line to the non-selected word lines can be performed.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A semiconductor device comprising:
   a plurality of memory cells provided in a matrix, and having a charge storage layer made of an insulating film provided on a semiconductor substrate;
   a plurality of word lines provided on the charge storage layer so that a plurality of memory cells arranged in a single line among the plurality of memory cells arranged in a matrix are coupled to the same word line; and
   an application section that, when reading data from a selected memory cell selected from the plurality of memory cells, applies a voltage to a selected word line that is coupled to the selected memory cell among the plurality of word lines, and applies a voltage having an opposite polarity to the voltage applied to the selected word line to non-selected word lines arranged on both adjacent sides of the selected word line.

2. The semiconductor device according to claim 1, wherein the application section keeps applying a voltage to the non-selected word lines while applying a voltage to the selected word line.

3. The semiconductor device according to claim 1, wherein the selected word line and the non-selected word lines are provided on the same charge storage layer.

4. The semiconductor device according to claim 1, wherein the charge storage layer is made of a silicon nitride film.

5. The semiconductor device according to claim 1, wherein electrons are stored in the charge storage layer by hot electron effects.

6. The semiconductor device according to claim 1, further comprising:
   a plurality of bit lines that cross the plurality of word lines in the semiconductor substrate so that a plurality of memory cells arranged in a single column among the plurality of memory cells arranged in a matrix are coupled to the same bit lines.

7. The semiconductor device according to claim 1, wherein electric charges are stored in the charge storage layer in the vicinity of the selected word line.

8. A flash memory device, comprising:
   input components;
   output components; and
   data storage components comprising:
   a plurality of memory cells provided in a matrix, and having a charge storage layer made of an insulating film provided on a semiconductor substrate;
   a plurality of word lines provided on the charge storage layer so that a plurality of memory cells arranged in a single line among the plurality of memory cells arranged in a matrix are coupled to the same word line; and
   an application section that, when reading data from a selected memory cell selected from the plurality of memory cells, applies a voltage to a selected word line that is coupled to the selected memory cell among the plurality of word lines, and applies a voltage having an opposite polarity to the voltage applied to the selected word line to non-selected word lines arranged on both adjacent sides of the selected word line.

9. The flash memory device according to claim 8, wherein the application section keeps applying a voltage to the non-selected word lines while applying a voltage to the selected word line.

10. The flash memory device according to claim 8, wherein the selected word line and the non-selected word lines are provided on the same charge storage layer.

11. The flash memory device according to claim 8, wherein the charge storage layer is made of a silicon nitride film.

12. The flash memory device according to claim 8, wherein electrons are stored in the charge storage layer by hot electron effects.

13. The flash memory device according to claim 8, further comprising:
   a plurality of bit lines that cross the plurality of word lines in the semiconductor substrate so that a plurality of memory cells arranged in a single column among the plurality of memory cells arranged in a matrix are coupled to the same bit lines.

14. The flash memory device according to claim 8, wherein electric charges are stored in the charge storage layer in the vicinity of the selected word line.

15. A method for controlling a semiconductor device comprising a plurality of memory cells arranged in a matrix, and having a charge storage layer made of an insulating film provided on a semiconductor substrate; and a plurality of word lines provided on the charge storage layer wherein a plurality of memory cells arranged in a single line among the plurality of memory cells arranged in a matrix are coupled to the same word line; the method comprising:

applying, when reading data from a selected memory cell selected from the plurality of memory cells, a voltage to a selected word line that is coupled to the selected memory cell among the plurality of word lines; and applying a voltage having an opposite polarity to the voltage applied to the selected word line to the non-selected word lines arranged on both adjacent sides of the selected word line.

16. The method for controlling a semiconductor device according to claim 15, wherein, during the applying of the voltage to the selected word line, the applying of the voltage having the opposite polarity to the voltage applied to the selected word line to the non-selected word lines is performed.

17. The method for controlling a semiconductor device according to claim 15, wherein a voltage is applied to the non-selected word lines while applying a voltage to the selected word line.

18. The method for controlling a semiconductor device according to claim 15, wherein the selected word line and the non-selected word lines are provided on the same charge storage layer.

19. The method for controlling a semiconductor device according to claim 15, wherein the charge storage layer is made of a silicon nitride film.

20. The method for controlling a semiconductor device according to claim 15, wherein electrons are stored in the charge storage layer by hot electron effects.

* * * * *